United States Patent
Rausch et al.

(10) Patent No.: US 6,432,777 B1
(45) Date of Patent: Aug. 13, 2002

(54) METHOD FOR INCREASING THE EFFECTIVE WELL DOPING IN A MOSFET AS THE GATE LENGTH DECREASES

(75) Inventors: Werner Rausch, Stormville; Ralph W. Young, Poughkeepsie, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/875,842

(22) Filed: Jun. 6, 2001

(51) Int. Cl.7 .................. H01L 21/84; H01L 21/8234
(52) U.S. Cl. .................. 438/275; 438/151; 438/149
(58) Field of Search ............... 438/151, 525, 438/527, 459, 455, 149, 275

(56) References Cited

U.S. PATENT DOCUMENTS

| | | |
|---|---|---|
| 4,649,629 A | 3/1987 | Miller et al. |
| 4,737,471 A | 4/1988 | Shirato et al. |
| 5,091,324 A | 2/1992 | Hsu et al. |
| 5,166,765 A | 11/1992 | Lee et al. |
| 5,185,279 A | 2/1993 | Ushiku |
| 5,329,138 A | 7/1994 | Mitani et al. |
| 5,527,721 A | 6/1996 | Farb |
| 5,753,958 A | 5/1998 | Burr et al. |
| 5,814,869 A | 9/1998 | Dennen |
| 5,965,917 A * | 10/1999 | Maszara et al. ............ 257/347 |
| 5,965,926 A | 10/1999 | Schwalke |
| 6,103,580 A | 8/2000 | Guo |
| 6,146,953 A | 11/2000 | Lee et al. |
| 6,291,325 B1 * | 9/2001 | Hsu ........................ 438/525 |
| 6,313,012 B1 * | 11/2001 | Horiuchi et al. ........... 438/459 |
| 6,337,505 B2 * | 1/2002 | Hwang et al. ............. 257/401 |
| 6,339,244 B1 * | 1/2002 | Krivokapic ................ 257/349 |

\* cited by examiner

Primary Examiner—John F. Niebling
Assistant Examiner—Walter L. Lindsay, Jr.
(74) Attorney, Agent, or Firm—Margaret A. Pepper; McGinn & Gibb

(57) ABSTRACT

A method of manufacturing a metal oxide semiconductor field effect transistor (MOSFET). The method forms an insulator layer over a substrate and a doped layer over the insulator layer. Further, the invention patterns a conductor layer over the doped layer. The conductor layer includes gate conductors. The invention implants a second impurity through the conductor layer and into the doped layer. The second impurity is of an opposite type than that of the first type of impurity. Also, the second impurity decreases the effective concentration of the first impurity in the doped layer. The amount of the second type of impurity that penetrates through the conductor layer into the doped layer changes depending upon the length of the gate conductors within the conductor layer.

19 Claims, 7 Drawing Sheets

METHOD FOR INCREASING THE EFFECTIVE WELL DOPING IN A MOSFET AS THE GATE LENGTH DECREASES

BACKGROUND OF THE INVENTION

1. Field of the Invention

The present invention generally relates to semiconductor devices and more particularly to a method of manufacturing semiconductor device that reduces undesirable short-channel effects.

2. Description of the Related Art

The threshold voltage of a metal oxide semiconductor field effect transistor (MOSFET) decreases as the gate length or channel length decreases for "short" gate lengths. This is commonly known as the "short channel effect". This short channel effect increases the off current of the minimum length MOSFET and is one of the constraining limitations in a MOSFET technology. Therefore, there is a need to reduce the short channel effect. Conventionally, the average well doping is increased as the gate length decreases to counter the short channel effect.

It is common practice to introduce higher well doping near the edge of the gate by an angled implantation after the gate is patterned. This is referred to as a "halo" implant. The halo implant doping is a larger fraction of the well doping for short gate lengths, thus increasing the average well doping for short gate lengths as compared to long gate lengths. A halo implant has limits in its effectiveness due to its limited spatial extent near the edge of the gate (e.g., the halo implant only exists around the edge of the gate conductor, not in the center region below the gate conductor).

The maximum electrically active dopant concentration achievable by halo implantation is limited by the solid solubility of the implanted dopant. Also, the angle at which the halo implant can be implanted is limited by the height and proximity of an adjacent gate structure which could potentially block the angled halo implant.

SUMMARY OF THE INVENTION

The invention includes a method of manufacturing a metal oxide semiconductor field effect transistor (MOSFET). The method forms an insulator layer over a substrate and a doped layer over the insulator layer. Further, the invention patterns a conductor layer over the doped layer. The conductor layer includes gate conductors. The invention implants a second impurity through the conductor layer and into the doped layer. The second impurity is of an opposite type than that of the first type of impurity. Also, the second impurity decreases the concentration of the first impurity in the doped layer. The amount of the second type of impurity that penetrates through the conductor layer into the doped layer changes depending upon the length of the gate conductors within the conductor layer.

The second impurity that penetrates through the conductor layer decreases in concentration as the length of the gate conductors decreases. Also, the decrease in the amount of the second impurity increases the concentration of the first impurity that remains in the doped layer. The invention anneals the MOSFET structure after the implanting process. The doped layer is formed by a deposited doped layer and an undoped layer followed by doping implantation.

BRIEF DESCRIPTION OF THE DRAWINGS

The foregoing and other objects, aspects and advantages will be better understood from the following detailed description of a preferred embodiment(s) of the invention with reference to the drawings, in which.

DETAILED DESCRIPTION OF PREFERRED EMBODIMENTS OF THE INVENTION

As mentioned above, it is advantageous to reduce the short channel effect. By increasing the well doping as the gate length decreases the short channel effect is countered and reduced. The commonly used halo implant has limits in its effectiveness toward increasing well doping due to its limited spatial extent near the edge of the gate.

The invention increases well doping without having to resort to an angled implantation. More specifically, the invention implants a first type of impurity before the gate conductor is formed and then subsequently implants a second type of impurity after the gate conductor is formed. The implantation of the second impurity penetrates through the gate conductor. The implanted second impurity is too deep in the structure to affect the first impurity except in regions where the gate conductor is present. The gate conductor reduces the vertical penetration depth of the second impurity to coincide with the well region. However, near the edge of the gate conductor, where a vertical step exists, the reduction of penetration depth of the second impurity is less than away from the gate edge. This is explained with reference to FIGS. 1 and 2.

Figure 1:
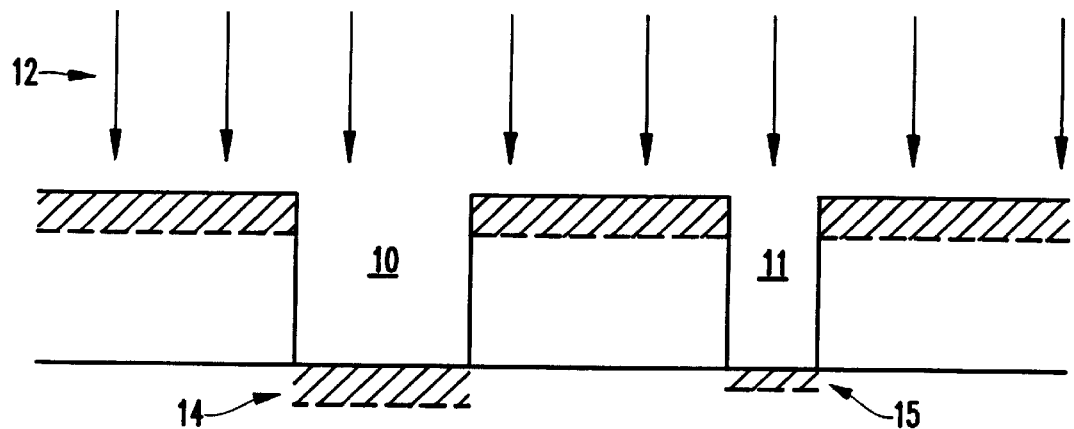
FIG. 1 is a schematic cross-sectional diagram of a partially completed integrated circuit chip structure.
Figure 2:
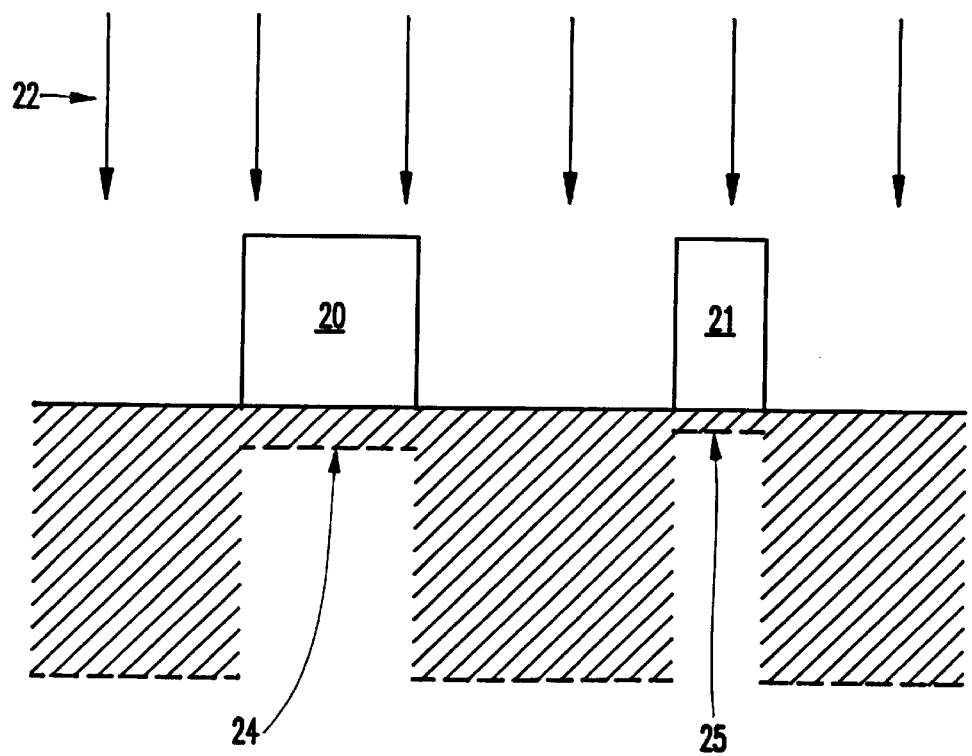
FIG. 2 is a schematic cross-sectional diagram of a partially completed integrated circuit chip structure.

More specifically, as shown in FIG. 1, an implantation of an impurity 12 into a narrow opening 11 produces a smaller dopant concentration 15 along the bottom of the opening when compared to the dopant concentration 14 from the same implantation 12 into a wide opening 10. It has been discovered that a complementary effect also occurs. As shown in FIG. 2, when implanting an impurity 22 through a patterned layer, the dopant concentration 25 is less beneath the narrow patterned layer 21 than the dopant concentration 24 under a wide patterned layer 20. By nature, an implanted impurity has a lateral spread as well as a vertical spread of the impurity concentration. In a wide structure the resulting impurity concentration at a fixed depth and lateral position has contributions from the impurities implanted directly above the lateral position and those implanted above nearby lateral positions which spread to the fixed lateral position. At the lateral center of a narrow structure of the types shown in FIGS. 1 and 2, the contribution of nearby lateral positions to the concentration at the fixed lateral position of the center is reduced or absent.

Figure 3:
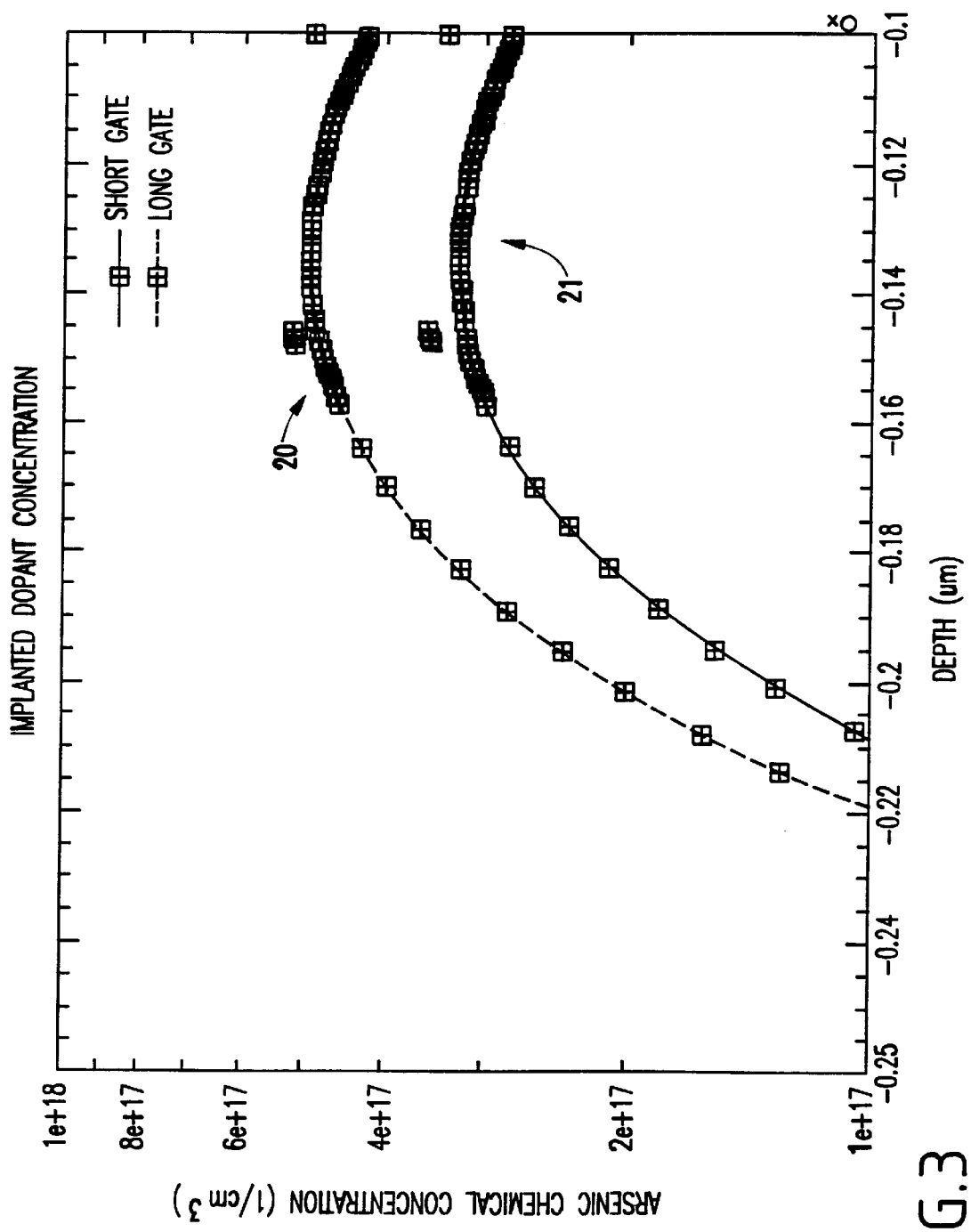
FIG. 3 is a graph illustrating the implanted dopant concentration for field effect transistors having different gate lengths.

This is also shown in FIG. 3 wherein the implanted dopant concentration curves along a vertical cross section through the well region are shown for each of the patterned gates, 20, 21. More specifically, FIG. 3 illustrates the plot of chemical concentration verses depth within the well region below each of the patterned gate 20, 21. It is seen that the implanted dopant concentration is less when implanted through the shorter gate 21 than when implanted through the longer gate 20.

The effect shown in FIG. 2 is used to advantage in the invention. More specifically, with the invention, a compensating dopant of a type opposite to the MOSFET well dopant is implanted with sufficient energy to penetrate through the gate material into the underlying semiconductor material where the well dopant resides (as shown with respect to FIGS. 4–8 discussed below). In regions where the well and oxide layers are not covered by the gate material, the implanted dopant penetrates much more deeply into the underlying material. The structure of the MOSFET device can be easily modified so that the deeper penetrating dopant in regions not protected by the gate conductor has no effect on the device. More specifically, a buried oxide layer can easily be located under the semiconductor material containing the well dopant or a heavily doped region can be formed under the semiconductor material containing the well dopant to ensure that the deeper penetrating dopant has no effect on the device.

As mentioned above, because of the decreased doping effects below the patterned gate layer 20,21, the compensating dopant under the gate material in the well region is lower in concentration for shorter gate length devices than for longer gate length devices. Since the net doping, i. e. the well dopant minus the compensating dopant (of opposite type) is the relevant doping for short channel behavior, the effective well doping increases as gate length decreases, even if the uncompensated well doping is independent of gate length.

Figure 4:
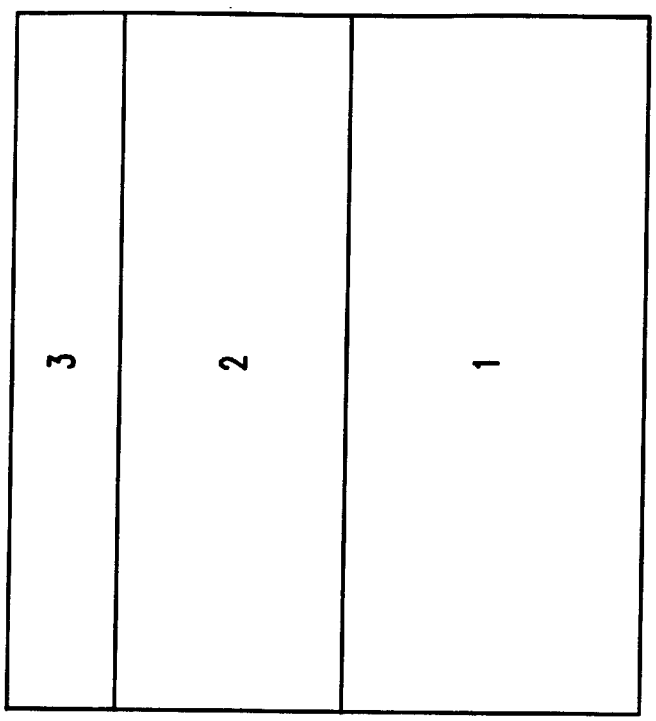
FIG. 4 is a schematic cross-sectional diagram of a partially completed integrated circuit chip structure.

The process of forming a device according to the invention is shown in FIGS. 4–8. More specifically, as shown in FIG. 4, in a semiconductor wafer 1 a structure with two additional layers 2, 3 is formed using standard processing methods. Layer 2 has the purpose of isolating layer 3 from layer 1. Layer 2 could comprise any an insulating material like silicon dioxide, or layer 2 could be a heavily doped silicon layer, where the doping is opposite to that of region 3. Layer 3 is preferably a doped silicon with the doping type chosen to be appropriate for the polarity of the MOSFET device being constructed. For example, for an NMOS device layer 3 is p-type. For a PMOS device layer 3 is n-type. This is called the well dopant. Layer 3 can be doped before or after it is formed on layer 2. The concentration of the well dopant in layer 3 is taken to be higher than the value needed to produce the target threshold voltage of the device because it will be decreased by the subsequent opposite type dopant implanted through the patterned gate conductors.

Figure 5:
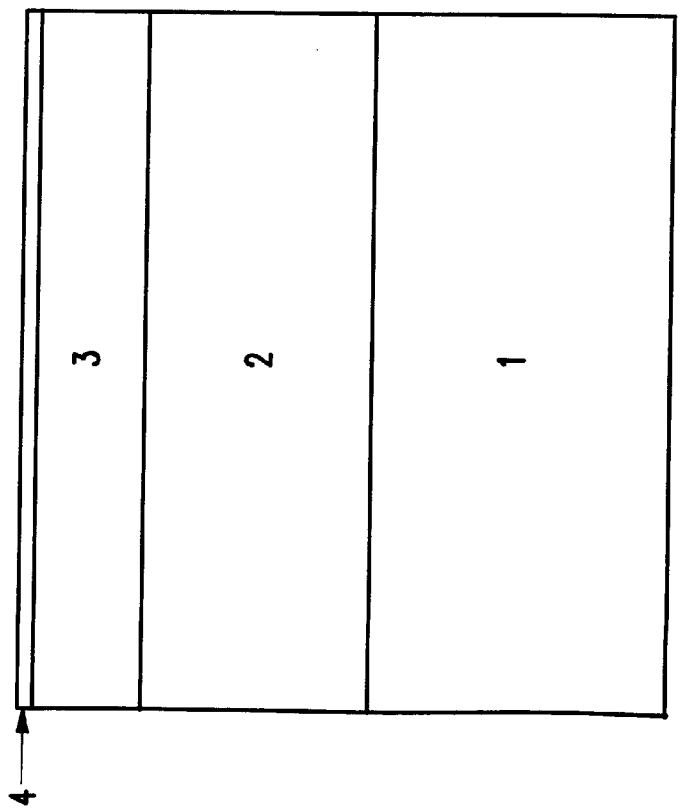
FIG. 5 is a schematic cross-sectional diagram of a partially completed integrated circuit chip structure.

As shown in FIG. 5, an insulating layer 4 is formed on the surface of the structure by deposition or reaction. Layer 4 preferably is the well-known gate insulator of the MOSFET structure and can be composed of silicon dioxide, silicon nitride, and high-K dielectrics in any combination. The thickness of layer 4 is a design parameter of the specific technology.

Figure 6:
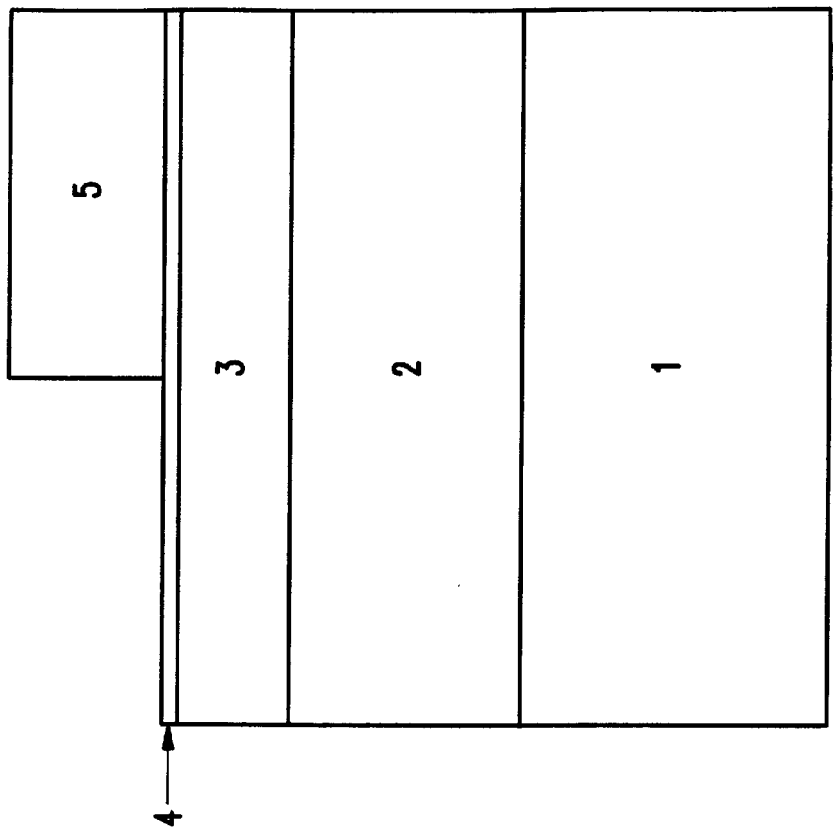
FIG. 6 is a schematic cross-sectional diagram of a partially completed integrated circuit chip structure.

In FIG. 6, a conducting film 5 is deposited and patterned using well-known techniques and forms the well-known gate of the MOSFET structure. It is commonly composed of heavily doped polysilicon or a conductive metal.

Figure 7:
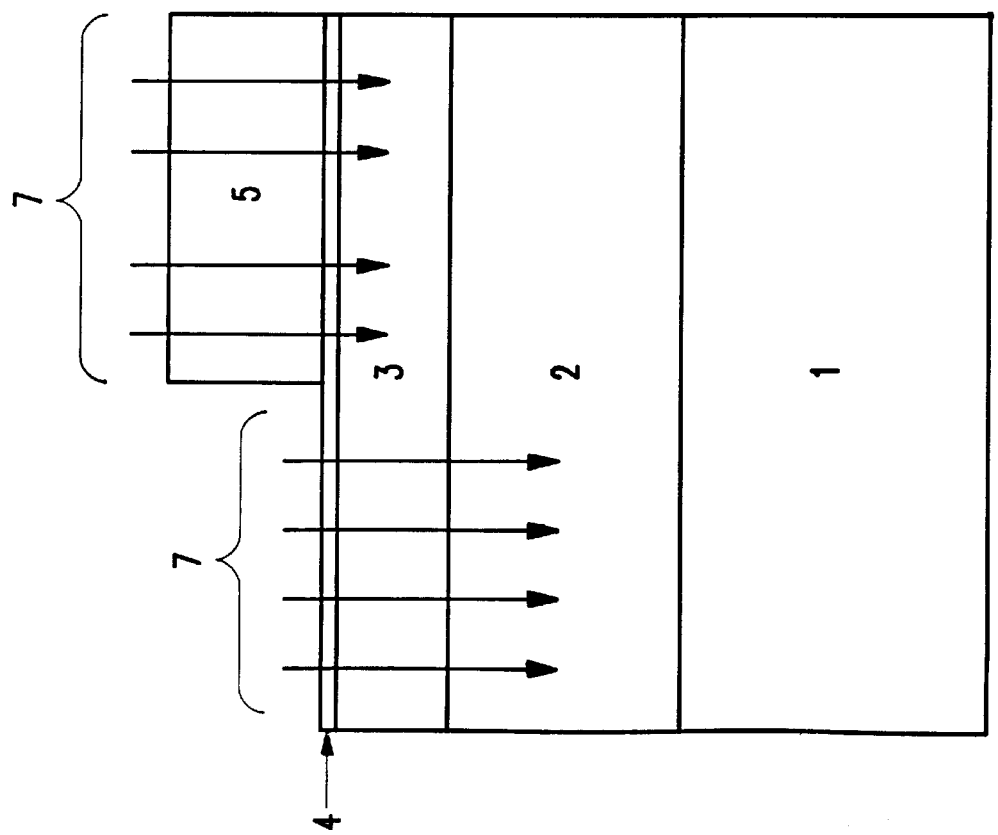
FIG. 7 is a schematic cross-sectional diagram of a partially completed integrated circuit chip structure.

In FIG. 7, a compensating dopant 7 of type opposite to the well dopant previously introduced in layer 3 is implanted with sufficient energy to penetrate through film 5 coming to rest in layer 3. This dopant 7 compensates the well dopant introduced into layer 3 by an amount which produces the desired threshold voltage in the device. In the area of the structure where film 5 had been removed by patterning the same implanted compensating dopant penetrates through layer 3 coming to rest in layer 2, where it has no effect. An appropriate anneal step is used to activate and diff-use the compensating dopant.

Figure 8:
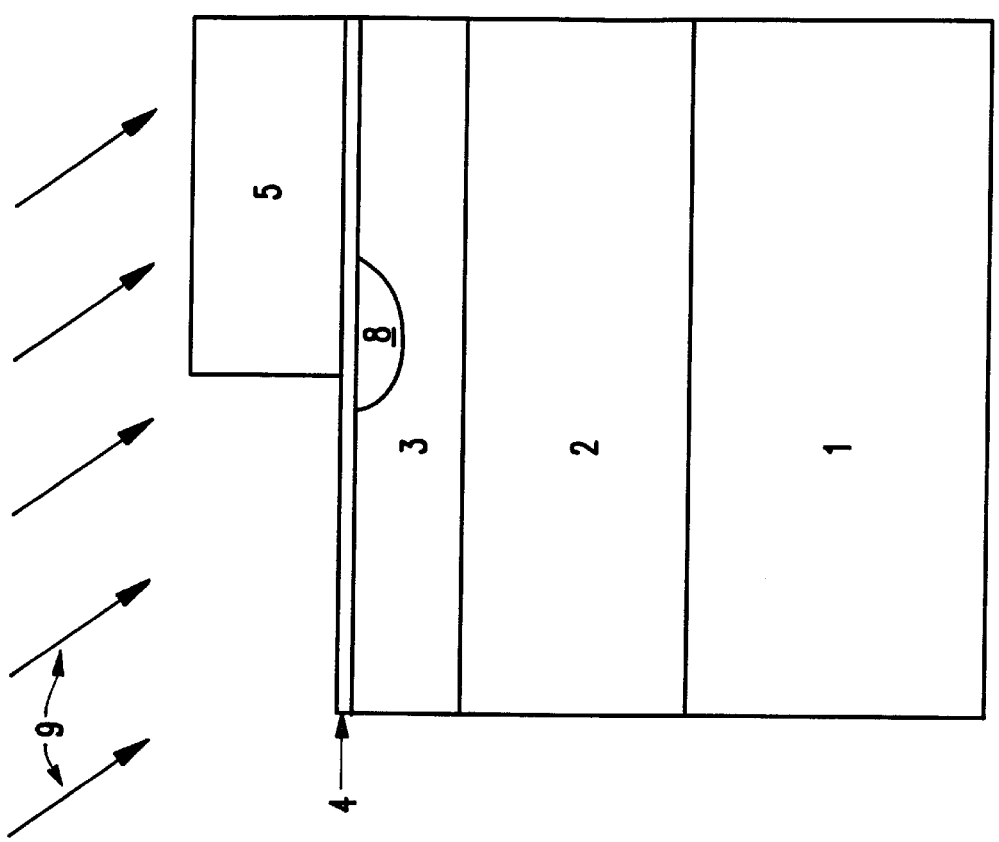
FIG. 8 is a schematic cross-sectional diagram of a partially completed integrated circuit chip structure.
Figure 9:
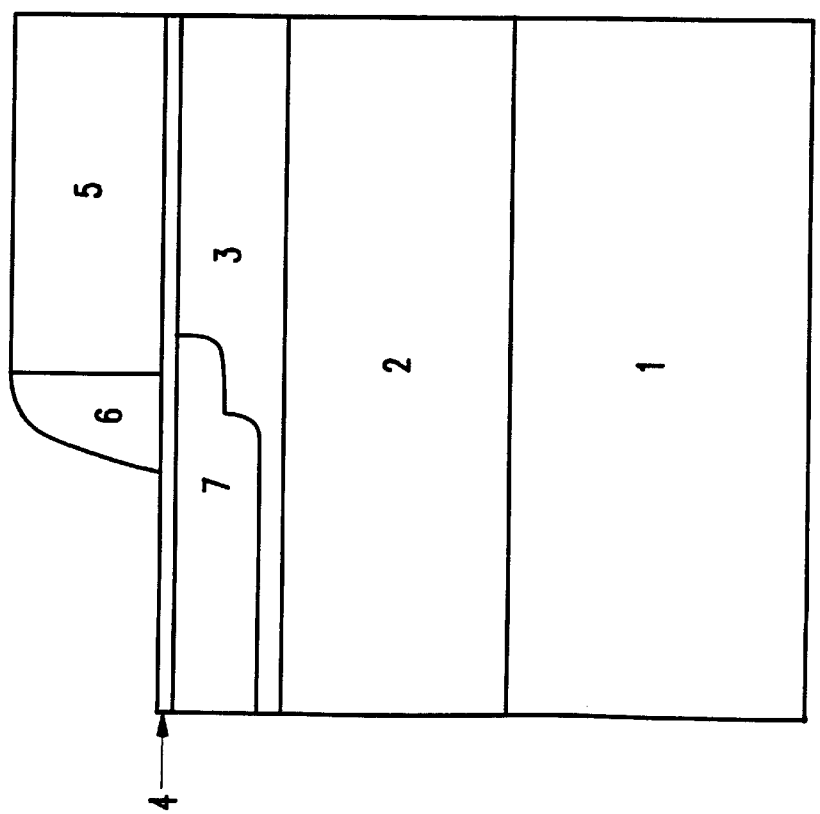
FIG. 9 is a schematic cross-sectional diagram of a partially completed integrated circuit chip structure.

As mentioned above a halo 8 may also be formed with the invention by way of an angled well-type impurity implant as shown in FIG. 8. Then, well-known processing steps are used to create a sidewall insulator 6 and a source/drain region 7 for a functional MOSFET device, as shown in FIG. 9.

An important advantage of the invention is that the average concentration of the compensating dopant implanted through the gate 5 into the well region 3 is less for a short gate conductor than for a long gate conductor, as explained. For the purpose of this description this is called the "butte effect". Also, for the purpose of this description the "gate length" is the area (or horizontal length) of contact between the gate conductor 5 and the underlying substrate (e.g., the gate oxide 4). Therefore, in FIG. 2, gate conductor 20 has a longer gate length than gate conductor 21 because gate conductor 20 has a greater area of contact with the substrate than gate conductor 21.

As explained above, the short channel effect (SCE) is well known in MOSFET devices. That is, as the gate length becomes shorter, the threshold voltage decreases. A halo implant is commonly used to reduce the SCE. The halo dopant is implanted locally under the edge of the gate and is the same type as the well dopant in layer 3. It has the effect of increasing the average doping in layer 3 for shorter gate length devices.

Figure 10:
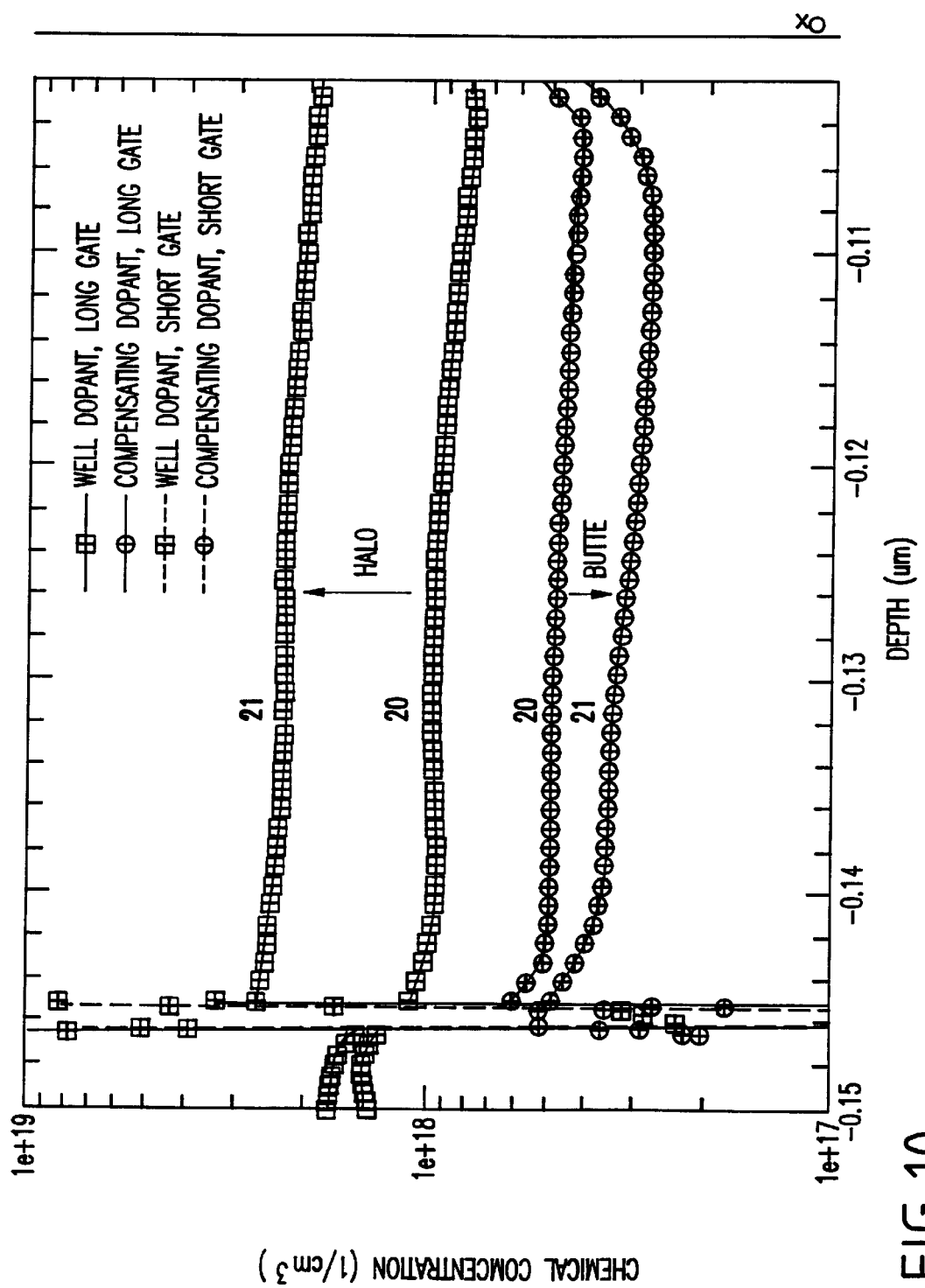
FIG. 10 is a graph illustrating the chemical concentration verses depth within the integrated circuit structure.

The inventive butte effect used with a compensating dopant further increases the average net doping in short gate devices compared to long gate devices. The combination of the halo and butte effect are illustrated in the plot shown in FIG. 10. The butte effect provides a method for reducing the SCE in addition to the use of a halo implant. In addition vertical profiles of the implanted compensating dopant for a short gate 21 and a long gate 20 are compared in the graph shown in FIG. 10. The effect of the halo implant is shown in FIG. 10 by the arrow labeled HALO. It is seen that the well concentration below the shorter gate 21 is larger than the concentration below the longer gate length 20. The butte effect is shown in FIG. 10 by the arrow labeled BUTTE. It is seen that the concentration of the compensating implant below the shorter gate 21 is less than the concentration below the longer gate length 20. The effective well doping concentration for the SCE is the well dopant minus the compensating dopant. This difference is larger with the butte effect (due to the compensating dopant implant) than without the butte effect.

Figure 11:
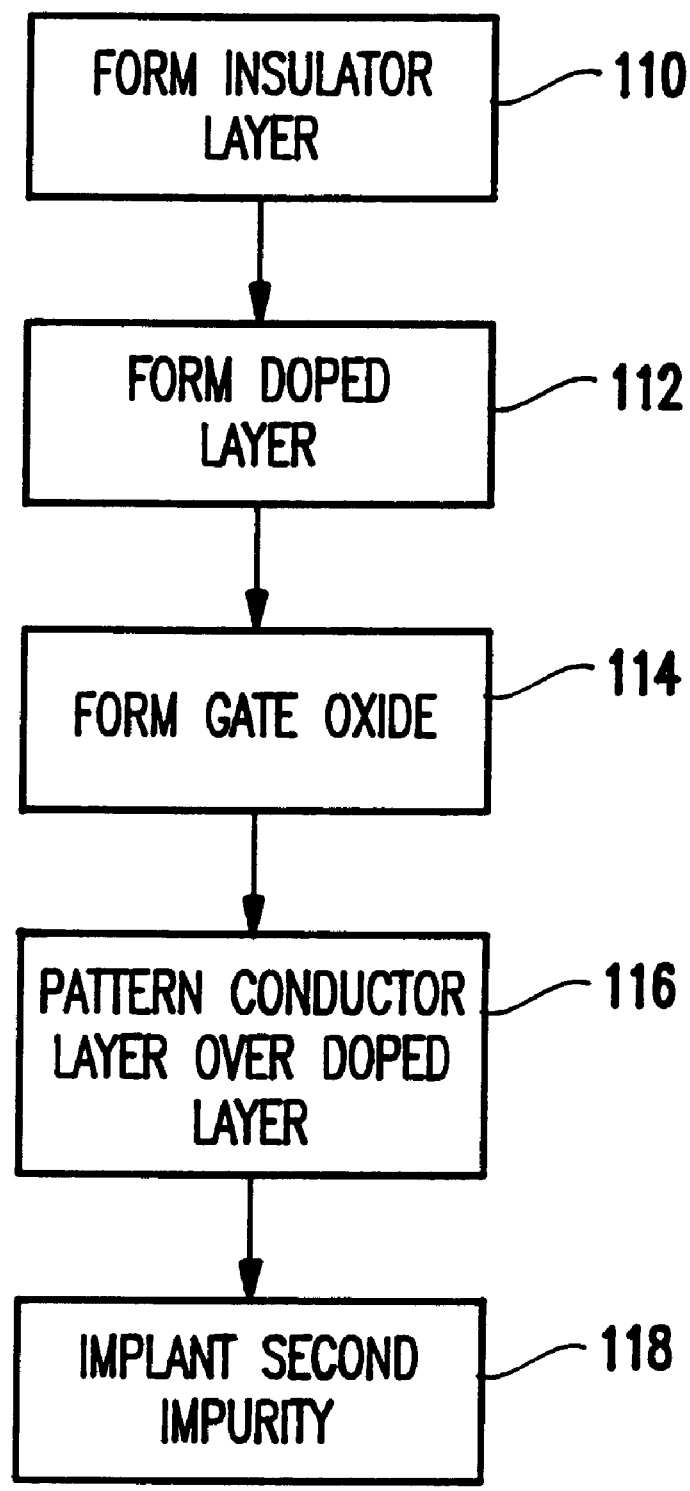
FIG. 11 is a flow diagram illustrating a preferred method of the invention.

The inventive process is shown in flowchart form in FIG. 11. More specifically, item 110 first forms an insulator layer 2 over a substrate 1. Then, in item 112, a doped layer 3 is formed over the insulator layer 2 using a first impurity. Item 114 shows forming the gate oxide 4. In item 116, the invention patterns of the conductor over the doped layer 3 to form gate conductors. In item 118 a second impurity 7 is implanted through the conductor layer and into the doped layer.

Therefore, with the invention, a larger portion of the first impurity remains uncompensated within the well region for short gate lengths thereby providing the necessary increase in well region doping to avoid the short channel effects. The invention increases well doping as gate length decreases in a broader spatial extent than that produced by a halo implant alone because the implantation energy of the second impurity is higher than the halo implant energy. The lateral spread of an implanted impurity naturally increases as the implantation energy increases.

In addition, the invention can be used in conjunction with a halo implant to give an additional performance benefit over and above that produced by an optimized halo implant alone. Two-dimensional process and device simulations have shown an additional performance benefit of 3% when the invention is used in conjunction with an optimized halo implant.

The penetration of an impurity through a gate conductor varies depending upon the length of the gate conductor. Therefore, the invention automatically allows relative increased doping for smaller channel length gate conductors. This is very important because short channel effects increase as the channel lengths decrease. The invention automatically increases the dopant in the well region for those shorter channel lengths which need an increase in doping to fight the increase in short channel effects that will be associated with such smaller channel lengths.

The present invention enables the device designer of any CMOS technology to increment the device performance by a few percent. This performance improvement can be used to gain competitive advantage or to delay the purchase of costly process tools otherwise needed to improve the device designs.

While the invention has been described in terms of preferred embodiments, those skilled in the art will recognize that the invention can be practiced with modification within the spirit and scope of the appended claims.

What is claimed is:

1. A method of manufacturing a metal oxide semiconductor field effect transistor (MOSFET), said method comprising:

forming an insulator layer over a substrate;

forming a doped layer over said insulator layer, wherein said doped layer includes a first type of impurity;

patterning a conductor layer over said doped layer, wherein said conductor layer includes gate conductors; and implanting a second type of impurity through said conductor layer and into said doped layer, wherein said second type of impurity is of an opposite type than that of said first type of impurity and said second type of impurity decreases an effective concentration of said first type of impurity in said doped layer.

2. The method in claim 1, wherein the amount of said second type of impurity that penetrates through said conductor layer into said doped layer changes depending upon a length of said gate conductors within said conductor layer.

3. The method in claim 2, wherein a decrease in said length of said gate conductors decreases an amount of said second type of impurity that penetrates through said conductor layer.

4. The method in claim 3, wherein said decrease in said amount of said second type of impurity increases an effective concentration of said first type of impurity remaining within said doped layer.

5. The method in claim 1, further comprising annealing said MOSFET structure after said implanting process.

6. The method in claim 1, wherein said forming of said doped layer comprises one of depositing a doped layer and depositing an undoped layer followed by a doping implantation.

7. A method of manufacturing a metal oxide semiconductor field effect transistor (MOSFET), said method comprising:

forming an insulator layer over a substrate;

forming a doped layer over said insulator layer, wherein said doped layer includes a first type of impurity;

patterning a conductor layer over said doped layer, wherein said conductor layer includes gate conductors;

implanting a second type of impurity through said conductor layer and into said doped layer, wherein said second type of impurity is of an opposite type than that of said first type of impurity and said second type of impurity decreases an effective concentration of said first type of impurity in said doped layer; and performing an angled implant of said first type of impurity to create a halo implant in said doped layer beneath said gate conductors.

8. The method in claim 7, wherein the amount of said second type of impurity that penetrates through said conductor layer into said doped layer changes depending upon a length of said gate conductors within said conductor layer.

9. The method in claim 8, wherein a decrease in said length of said gate conductors decreases an amount of said second type of impurity that penetrates through said conductor layer.

10. The method in claim 9, wherein said decrease in said amount of said second type of impurity increases an effective concentration of said first type of impurity remaining within said doped layer.

11. The method in claim 7, further comprising annealing said MOSFET structure after said implanting process.

12. The method in claim 7, wherein said forming of said doped layer comprises one of depositing a doped layer and depositing an undoped layer followed by a doping implantation.

13. A method of manufacturing a metal oxide semiconductor field effect transistor (MOSFET), said method comprising:

forming an insulator layer over a substrate;

forming a doped layer over said insulator layer, wherein said doped layer includes a first type of impurity;

patterning a conductor layer over said doped layer, wherein said conductor layer includes gate conductors; and decreasing an effective concentration of said first type of impurity in said doped layer by implanting a second type of impurity through said conductor layer and into said doped layer, wherein said second type of impurity is of an opposite type than that of said first type of impurity.

14. The method in claim 13, wherein in said decreasing process said second type of impurity passes through regions of said insulator layer not protected by gate conductors and decreases an effective concentration of said first type of impurity from regions of said insulator layer protected by said gate conductors to a level greater than zero and less than originally present in said doped layer.

15. The method in claim 13, wherein the amount of said second type of impurity that penetrates through said conductor layer into said doped layer changes depending upon a length of said gate conductors within said conductor layer.

16. The method in claim 15, wherein a decrease in said length of said gate conductors decreases an amount of said second type of impurity that penetrates through said conductor layer.

17. The method in claim 16, wherein said decrease in said amount of said second type of impurity increases an effective concentration of said first type of impurity remaining within said doped layer.

18. The method in claim 13, further comprising annealing said MOSFET structure after said implanting process.

19. The method in claim 13, wherein said forming of said doped layer comprises one of depositing a doped layer and depositing an undoped layer followed by a doping implantation.

* * * * *